United States Patent [19]

Donohue

[11] 3,956,461

[45] May 11, 1976

[54] ORTHORHOMBIC RARE EARTH Hf AND Zr SULFIDES AND SELENIDES

[75] Inventor: Paul Christopher Donohue, Wilmington, Del.

[73] Assignee: E. I. Du Pont de Nemours and Company, Wilmington, Del.

[22] Filed: May 31, 1974

[21] Appl. No.: 476,133

[52] U.S. Cl............................. 423/263; 252/62.3 V; 252/520; 252/521; 423/508; 423/511
[51] Int. Cl.² ........................................ C01F 17/00
[58] Field of Search.................... 423/263, 508, 511; 252/62.3 V, 520, 521

[56] References Cited
UNITED STATES PATENTS
3,294,701 12/1966 Vogel et al. ........................ 423/263
3,371,041 2/1968 Holtzberg ....................... 423/263 X OTHER PUBLICATIONS
Takahashi et al., "Materials Research Bull.", Vol. 6, 1971, pp. 173–182.

Primary Examiner—Herbert T. Carter

[57] ABSTRACT

Solid compositions of the formula $$M_2M'X_5$$

where M is one or more element selected from the group consisting of the rare earths of atomic numbers 57–71 and yttrium, but excluding europium and ytterbium, M' is one or more of zirconium and hafnium, and X is sulfur or selenium, with the proviso that when X is selenium, the compound is (1) of the formula $$M_2''ZrSe_5$$

where M'' is one or more element selected from the group consisting of the rare earths of atomic numbers 57–65 except europium, or (2) of the formula $$M_2'''HfSe_5$$

where M''' is one or more rare earth of atomic number 57–59, are useful as semiconductors.

6 Claims, No Drawings

ORTHORHOMBIC RARE EARTH HF AND ZR SULFIDES AND SELENIDES

BACKGROUND OF THE INVENTION

1. Field of the Invention

This invention relates to solid sulfides and selenides, and more particularly to such compounds containing one or more rare earth element and hafnium or zirconium.

2. Description of the Prior Art

Ternary sulfides and selenides of the rare earths have been known for both the lanthanide and actinide series. Compositions of the formula $Ce_2US_5$, $Gd_2US_5$, $Pu_2US_5$ as well as $U_3S_5$ (i.e., $U_2^{III}U^{IV}S_5$) have been disclosed by Marcon et al. in *Rev. Int. Hautes Temper. et Refract*, t. 5, pp 51–54 (1968). The crystal structure was recognized to be orthorhombic. A detailed structural analysis was made for $U_3Se_5$ by Moseley et al. in *Acta Cryst.*, B28, pp. 1816–1821 (1972) and for $U_3S_5$ by Potel et al. in *C. R. Acad. Sc. Paris*, t. 275, pp 1419–1421 (1972).

SUMMARY OF THE INVENTION

Solid compositions have now been discovered which are of the formula $$M_2M'X_5$$

where
M is one or more element selected from the group consisting of the rare earths of atomic numbers 57–71 and yttrium, but excluding europium and ytterbium,
M' is one or more of zirconium and hafnium, and
X is sulfur or selenium,
with the proviso that when X is selenium, the compound is (1) of the formula $$M_2''ZrSe_5$$

where M'' is one or more element selected from the group consisting of the rare earths of atomic numbers 57–65 except europium, or (2) of the formula $$M_2'''HfSe_5$$

where M''' is one or more rare earth of atomic number 57–59,
said compositions being characterized by orthorhombic crystal structure consistent with space groups Pnam or Pna2$_1$. These compounds are semiconductors providing a wide range of electrical resistivity which can be modified by doping with altervalent ions.

DETAILED DESCRIPTION OF THE INVENTION

The sulfides of this invention are of the formula $$M_2M'S_5$$

where M is one or more of lanthanum, cerium, praseodymium, neodymium, promethium, samarium, gadolinium, terbium, dysprosium, holmium, erbium, thulium, lutetium an yttrium, and M' is one or more of hafnium and zirconium. Those compositions where M' is Zr, namely compositions of the formula $M_2ZrS_5$, are preferred because of their broader applicability and the availability of their source materials. The remaining sulfides, namely those of the formula $$M_2HfS_5,$$

are also useful.

The selenides of this invention are of the formula $$M_2''ZrSe_5$$

where M'' is one or more of lanthanum, cerium, praseodymium, neodymium, promethium, samarium, gadolinium and terbium, or of the formula $$M_2'''HfSe_5$$

where M''' is one or more of lanthanum, cerium and praseodymium.

Solid solutions of the individual compounds are also contemplated as being within the scope of the invention. Primary criteria for solid solutions are a close match in the size of the ions, and the formation of the same phase for both end-members comprising the solid solution. In this respect the striking similarity among the rare earths on the one hand and between the pair of elements Zr and Hf on the other is well known. Of special practical importance is the difficulty and expense of separating Hf and Zr as well as various of the trivalent lanthanide ions. It will be convenient then to prepare compositions containing a mixture of lanthanide ions such as, for example, mischmetal mixtures containing predominantly elements of atomic number 57–60. Similarly, the zirconium sources will frequently contain a lesser amount of hafnium which is naturally incorporated in the product. Accordingly, formulae specifying zirconium or hafnium should be interpreted as allowing up to about 10% of the other element. The extent of solid solution for these combinations is expected to be virtually complete.

Other ions which form the same phase, but differ considerably in size, may be expected to form very limited solutions, generally not exceeding about ten percent of one component in the other. Thus, the sulfides and selenides on the one hand, and the lanthanide and actinide rare earths on the other may be substituted for each other up to about ten percent, and such variations should be allowed within the scope of specific formulae.

It has been determined that the compounds $M_2M'X_5$ do not form with the rare earth elements Eu and Yb. This apparent anomaly is believed to result from the special stability of the divalent species Eu$''$ and Yb$''$ particularly in the reducing environment rich in sulfides whereby other phases are preferentially formed. It is nevertheless to be expected that small amounts of these or other divalent rare earth ions can be incorporated in the phase generally characterized by the formula $M_2'''M''^{IV}X_5$. In such an event the imbalance in oxidation number may be accommodated by anion vacancies or by valence compensation with altervalent or missing cations. The quantitative extent of this effect is quite small and difficult to assess analytically, being limited to no more than about ten percent, but such slight departues from idealized stoichiometry are recognized as significantly affecting properties such as electrical resistivity. Thus, compositions with formal valences such as $$Sm_{1.8}'''Sm_{0.2}''Zr^{IV}S_{4.9}$$

$$Sm_{1.9}'''Sm_{0.1}''Zr_{0.9}^{IV}Ta_{0.1}^{V}S_5$$

are considered to be within the scope of this invention.

This genus of compositions is readily recognized by its characteristic X-ray diffraction pattern. Powder data by the Debye-Scherrer method preferably using precision Guinier cameras, reveal complex orthorhombic diffraction patterns with systematic absences of $0kl$ reflections, where $k+l$ is odd, and $h0l$ reflections, where $h$ is odd. These are consistent with space groups Pnam or Pna2$_1$. A typical pattern is provided in Table I which serves as a prototype to be modified using the lattice constants given for the individual compositions. The volume of the orthorhombic unit cell increases in a regular manner with increasing size of the rare earth ions, in the range of about 620–700A$^3$ for the sulfides and about 740–790A$^3$ for the selenides.

Detailed structural analysis based on single crystal examination shows the new compositions to be of the same structural type as $U_3Se_5$ described in the previously cited reference of Moseley et al.

The compositions of the invention are stable crystalline solids which can be prepared by direct combination from the elements or from precursor compounds which provide the elements under the reaction conditions. Combining of the elements generally occurs by solid state diffusion, and times and temperatures appropriate to such reactions are needed. In general temperatures in the range of about 500°–1200°C are used for times ranging from about four hours to 4 days or more, preferably in several stages with intermediate grinding to promote intimate contact between reactants. Air and water vapor should be expelled from the reaction environment to prevent oxidation or hydrolysis of the chalcogenides at the elevated temperature.

The reaction may be carried out within a closed vessel such as a silica tube using the appropriate quantities of the elements. Under these conditions gradual heating is employed to assure that high pressure of the gaseous chalcogen is not built up before it can be assimilated by solid state diffusion processes. Thereafter the temperature is preferably raised to 800°–1200°C to speed up diffusion. During the early stages of reaction a thermal gradient along the reaction tube is useful to prevent excess pressure. Reactivity is promoted by using finely powdered mixtures of the elements, as well as by the addition of a few crystals of iodine. Any tendency for reactivity with a silica vessel can be reduced by first applying a protective coating of carbon to the inner walls e.g., by pyrolysis of toluene. While it is desirable to react the elements in the proper stoichiometry for $M_2M'X_5$, the stability of this structure is sufficient to insure its formation even with considerable departure from the proper proportions. Adjuvants such as iodine which promote vapor transport assist in separating excess reactants from the usually reddish crystals of the product.

Alternatively, the source of metallic elements may be a mixture of oxides or carbonates over which is caused to flow a gaseous source of the chalcogen such as $CS_2$, $H_2S$, $H_2Se$ or $CSe_2$. Other modifications will be readily apparent such as the direct combination with preformed sulfides of certain of the metals.

EXAMPLES OF THE INVENTION

The following examples, illustrating the novel products of this invention and their preparation and use, are given without any intention that the invention be limited thereto. All temperatures are in degrees Centigrade unless otherwise specified.

EXAMPLE 1

A mixture of elements in the atomic ratio, $SmZrS_3$ (0.4451 g. Sm, 0.2701 g. Zr, 0.02848 g. S) was sealed with iodine (~0.05 g.) in an evacuated silica tube (15 mm O.D./13 mm I.D. × 6 in.). The inside of the tube was previously coated with carbon by pyrolysis of toluene. The tube was heated in a natural gradient tube furnace with the end containing the reactants in the center of the furnace while the other end extended to the furnace opening. The center region was heated initially at 600°C. for two days, the outer region was at about 300°C. The tube was cooled, shaken to better mix the reagents and reheated for 2 days at 800°C. in the center region, 600° in the cooler end. After 2 days, the tube was cooled, opened and the product ground in an agate mortar. It was resealed in a silica tube and reheated at 900°C. over the entire tube. After about one day, the tube was cooled and opened. The product consisted of a brown maroon microcrystalline powder which gave a distinctive x-ray powder pattern.

This pattern was later identified using a Guinier x-ray camera as arising from an orthorhombic unit cell with dimensions $a = 11.491A$, $b = 7.285A$, $c = 7.909A$.

The true stoichiometry of this phase was later identified as essentially $Sm_2ZrS_5$ from work on analogous compositions having the same x-ray pattern.

EXAMPLE 2

A mixture of elements in the atomic ratio La, Zr, 3S (0.6974 g. La, 0.4580 g. Zr, and 0.4830 g. S) was sealed with 0.05 g. $I_2$ in a silica tube of the type described in Example 1. It was heated for two days in a natural gradient tube furnace with the end containing the reactants at 600°C., the other end at 200°C. The tube was cooled, removed from the furnace and shaken to better mix the reactants. After two days additional heating at 800°C (cool end 400°C) some zirconium wire still remained. It was reheated at 850°C. over the entire tube for two days. The product consisted of a red brown microcrystalline powder and a crystalline film. The x-ray powder pattern of the powder was identified as being like that of Example 1. The film was identified as $Zr_4S_3$.

The product was reground; pellets were pressed, sealed in silica and heated at 1000°C. for two days. The x-ray powder pattern was similar to that of Example 1. Red crystals were present which were suitable for single crystal x-ray diffraction. The unit cell and space group were determined using Buerger precession camera techniques. The cell dimensions were refined from data taken with a Guinier camera: $a = 11.4864 \pm 0.0005A$, $b = 7.3894 \pm 0.0003A$, $c = 8.2167 \pm 0.0005A$, space group Pnam or Pna2$_1$. The Guinier powder pattern is shown in Table I.

Another preparation of the same composition made in a similar manner produced sufficient crystals of this phase for accurate determination of density. Values of 5.09, 5.03 and 5.05 g/cm$^3$ were obtained. These results do not agree well with a formula $LaZrS_3$ (calculated density is 4.70 with six molecules of $LaZrS_3$ per unit cell). However, they do agree well with a calculated density of 5.065 for $La_2ZrS_5$, with four molecules per unit cell.

The crystals were semiconductive ($\rho = 10^{10}$ ohm cm at 298°K).

TABLE I

Guinier X-Ray Powder Pattern of $La_2ZrS_5$

| I | h | k | l | d(observed) | d(calc.) |
|---|---|---|---|---|---|
| 10 | 1 | 1 | 0 | 6.2096 | 6.2145 |
| 5 | 2 | 0 | 0 | 5.7310 | 5.7432 |
| 20 | 0 | 1 | 1 | 5.4897 | 5.4944 |
| 20 | 2 | 1 | 0 | 4.5324 | 4.5346 |
| 30 | 0 | 0 | 2 | 4.1055 | 4.1084 |
| 10 | 2 | 1 | 1 | 3.9689 | 3.9702 |
| 55 | 0 | 2 | 0 | 3.6931 | 3.6947 |
| 50 | 1 | 2 | 0 | 3.5158 | 3.5172 |
| 90 | 1 | 1 | 2 | 3.4260 | 3.4272 |
| 100 | 3 | 1 | 0 | 3.3999 | 3.3995 |
| 70 | 2 | 0 | 2 | 3.3394 | 3.3414 |
| 10 | 1 | 2 | 1 | 3.2033 | 3.2334 |
| 15 | 0 | 2 | 2 | 2.7463 | 2.7472 |
| 90 | 4 | 1 | 0 | 2.6751 | 2.6766 |
| 100 | 1 | 2 | 2 | 2.6715 | 2.6718 |
| 15 | 3 | 2 | 0 | 2.6589 | 2.6587 |
| 95 | 3 | 1 | 2 | 2.6190 | 2.6191 |
| 20 | 0 | 1 | 3 | 2.5675 | 2.5682 |
| 15 | 4 | 1 | 1 | 2.5452 | 2.5450 |
| 10 | 3 | 2 | 1 | 2.5298 | 2.5296 |
| 85 | 2 | 2 | 2 | 2.4780 | 2.4783 |
|  | 2 | 0 | 3 |  | 2.4722 |
| 25 | 1 | 3 | 0 | 2.4081 | 2.4084 |
| 25 | 0 | 3 | 1 | 2.3588 | 2.3594 |
| 65 | 4 | 0 | 2 | 2.3537 | 2.3536 |
| 15 | 2 | 1 | 3 | 2.3443 | 2.3444 |
| 45 | 2 | 3 | 0 | 2.2635 | 2.2637 |
|  | 4 | 2 | 0 |  | 2.2673 |
| 15 | 4 | 1 | 2 | 2.2430 | 2.2426 |
| 10 | 5 | 1 | 0 | 2.1941 | 2.1937 |
| 30 | 2 | 3 | 1 | 2.1823 | 2.1824 |
|  | 4 | 2 | 1 |  | 2.1856 |
| 10 | 1 | 2 | 3 | 2.1607 | 2.1618 |
| 15 | 1 | 3 | 2 | 2.0776 | 2.0777 |
| 20 | 3 | 3 | 0 | 2.0717 | 2.0715 |
| 70 | 0 | 0 | 4 | 2.0540 | 2.0541 |
|  | 2 | 2 | 3 |  | 2.0546 |
| 50 | 4 | 2 | 2 | 1.9847 | 1.9851 |
| 45 | 2 | 3 | 2 | 1.9826 | 1.9827 |
|  | 4 | 0 | 3 |  | 1.9819 |
| 5 | 5 | 2 | 0 | 1.9508 | 1.9509 |
|  | 1 | 1 | 4 |  | 1.9504 |
| 70 | 5 | 1 | 2 | 1.9353 | 1.9351 |
|  | 2 | 0 | 4 |  | 1.9342 |
| 40 | 6 | 0 | 0 | 1.9147 | 1.9144 |
|  | 4 | 3 | 3 |  | 1.9143 |
| 10 | 3 | 3 | 3 | 1.9077 | 1.9077 |
| 10 | 5 | 1 | 1 | 1.8981 | 1.8981 |
| 45 | 4 | 0 | 0 | 1.8698 | 1.8696 |
|  | 2 | 4 | 4 |  | 1.8711 |
| 10 | 0 | 3 | 3 | 1.8316 | 1.8316 |
| 40 | 1 | 0 | 0 | 1.8237 | 1.8239 |
|  | 4 | 1 | 1 |  | 1.8230 |
| 30 | 0 | 4 | 4 | 1.7954 | 1.7953 |
| 5 | 1 | 1 | 1 | 1.7806 | 1.7806 |
| 20 | 1 | 4 | 4 | 1.7740 | 1.7735 |

EXAMPLE 3

A mixture of the elements in the atomic ratio corresponding to $YHfS_3$ was prepared and sealed into a carbonized silica tube with a few crystals of iodine, and heated in a program similar to that described in Example 2. The product contained red crystals having an x-ray powder pattern like that of Example 1. More precise Guinier data indicated orthorhombic cell constants: $a = 11.459$, $b = 7.221$, $c = 7.722$ A.

A single crystal of this preparation permitted a detailed analysis of the crystal structure. Yttrium (and thus other equivalent lanthanide ions) was shown to be in sites of 8-fold coordination. Hafnium (and thus the equivalent Zr) occupies sites of 7-fold coordination. Sulur (or equivalent selenium) occupies two distinct sites; one a distorted tetrahedron and the other a nearly square pyramid. The refined structure shows unequivocally that the formula is of the type $Y_2HfS_5$ with four molecules for each orthorhombic unit cell.

EXAMPLE 4

A mixture of the elements in the atomic ratio $Sm_{1.3}HfS_{3.3}$ was heated along with a trace of iodine in a manner similar to that of Example 2. After a final heating at 1100°C for 2 days the sample tube contained well formed black-red crystals and some white crystalline material. The white material was identified as $HfSiO_4$. The red material produced an x-ray powder pattern like that of Example 1 with $a = 11.4374$, $b = 7.2720$, $c = 7.8954$ A. The crystal density was determined as 6.45 and 6.40 g/cm³ in two measurements. The density calculated for $Sm_2HfS_5$ with 4 molecules per unit cell is 6.47. The red crystals were semiconductive (0.8 ohm cm at 298°K and activation energy $E_a = 0.05$ eV) with a Seebeck coefficient of $-350$ $\mu V$/degree. The slightly low density and the surprisingly low resistivity value are consistent with a slight sulfur deficiency and a concomitant lower valent cation such as $Sm^{+2}$ in place of some $Sm^{+3}$ ions.

EXAMPLE 5

Using the method of Example 2 and a similar heating schedule (400°/200° — 1 day; 600°/300° — 2 days; 800°/400° — 2 days; 1150° — 2 days) an elemental mixture corresponding to the stoichiometry $CeHfS_3$ was reacted. The red crystals gave an x-ray pattern similar to that of Example 1, which could be indexed on the basis of an orthorhombic unit cell, $a = 11.417$, $b = 7.339$, $c = 8.128$ A. To one of these crystals of $Ce_2HfS_5$ gallium contacts were applied in order to measure electrical resistivity. When plotted as log $\rho$ in ohm-cm vs/ the reciprocal of absolute temperature the data yield a straight line between 400° and 550°K ($\rho 298K > 10^{10}$ ohm-cm; $\rho 400K = 1.85 \times 10^8$; $\rho 550K = 1.73 \times 10^5$; $E_a = 0.7$ eV). Crystals or sintered plugs of such material with appropriate electrical leads may be used in a probe to indicate the temperature (e.g. of a furnace) by a simple measurement of resistance.

EXAMPLE 6

Using the method of Example 2 and a similar heating schedule (400°/200° — 1 day, 700°/300° — 2 days, 1200°/1000° — 3 days) an elemental mixture corresponding to the stoichiometry $La_2Zr_{0.9}Nb_{0.1}S_5$ was reacted. The product consisted of red-brown microcrystals which, except for a few extra lines, could be indexed on the basis of an orthorhombic unit cell $a = 11.504$, $b = 7.397$, $c = 8.221$ of the type previously described. The small but distinct difference in cell parameters from that of Example 2 ($La_2ZrS_5$) indicates the incorporation of some niobium into the $La_2ZrS_5$ lattice.

EXAMPLES 7–17

In the same manner as described above other elemental mixtures of a rare earth metal, zirconium or hafnium, and either sulfur or selenium were reacted to yield the product $M_2M'X_5$ having the characteristic x-ray pattern described for the previous examples and typified in Table I. Table II gives the orthorhombic lattice parameters for each pattern. The same characteristic phase results as the major product whether the starting mixture has the appropriate composition $M_2M'X_5$ or the rare earth-poor ratio of $MM'X_3$. In the latter case side products such as zirconium sulfide are often present as impurities.

TABLE II

| Example | Initial Reactant Ratio | Lattice parameters, A | | |
|---|---|---|---|---|
| | | a | b | c |
| 7 | HoHfS$_3$ | 11.415 | 7.204 | 7.777 |
| 8 | YZrS$_3$ | 11.453 | 7.234 | 6.748 |
| 9 | LaHfSe$_3$ | 11.919 | 7.680 | 8.524 |
| 10 | LaZrSe$_3$ | 12.058 | 7.719 | 8.505 |
| 11 | SmZrSe$_3$ | 12.026 | 7.607 | 8.203 |
| 12 | CeHfSe$_3$ | 11.886 | 7.654 | 8.429 |
| 13 | Ho$_2$ZrS$_5$ | 11.478 | 7.211 | 7.715 |
| 14 | Er$_2$ZrS$_5$ | 11.466 | 7.196 | 7.681 |
| 15 | Er$_2$HfS$_5$ | 11.442 | 7.193 | 7.681 |
| 16 | Gd$_2$ZrSe$_5$ | 12.035 | 7.617 | 8.154 |
| 17 | Tb$_2$ZrSe$_5$ | 12.020 | 7.596 | 8.138 |

Although the invention has been described and exemplified by way of specific embodiments, it is not intended that it be limited thereto. As will be apparent to those skilled in the art, numerous modifications and variations of these embodiments can be made without departing from the spirit of the invention or the scope of the following claims.

I claim:

1. Solid compositions of the formula $$M_2M'X_5$$

where
  1. M is one or more element selected from the group consisting of the rare earths of atomic numbers 57—71 and yttrium, but excluding europium and ytterbium,
  2. M' is one or more of zirconium and hafnium, and
  3. X is sulfur or selenium, with the proviso that when X is selenium, the compound is
     a. of the formula $$M_2''ZrSe_5$$

where M'' is one or more element selected from the group consisting of the rare earths of atomic numbers 57–65 except europium, or
     b. of the formula $$M_2'''HfSe_5$$

where M''' is one or more rare earth of atomic number 57–59, said compositions being characterized by orthorhombic crystal structure consistent with space groups Pnam or Pna2$_1$.

2. Solid compositions of claim 1 which are sulfides of the formula $$M_2ZrS_5.$$

3. A solid composition of claim 2 of the formula $$La_2ZrS_5.$$

4. Solid compositions of claim 1 which are sulfides of the formula $$M_2HfS_5.$$

5. Solid compositions of claim 1 which are selenides of the formula $$M''_2ZrSe_5$$

where M'' is one or more element selected from the group consisting of the rare earths of atomic numbers 57–65 except europium.

6. Solid compositions of claim 1 which are selenides of the formula $$M_2'''HfSe_5$$

where M''' is one or more rare earth of atomic number 57–59.

* * * * *

UNITED STATES PATENT OFFICE
CERTIFICATE OF CORRECTION

PATENT NO. : 3,956,461
DATED : May 11, 1976
INVENTOR(S) : Paul Christopher Donohue It is certified that error appears in the above-identified patent and that said Letters Patent are hereby corrected as shown below:

Column 1, line 62, "lutetium an yttrium" should read --lutetium and yttrium--.

Column 2, line 12, "$M_2'''MfSe_5$" should read --$M_2'''HfSe_5$--.

Signed and Sealed this

Twelfth Day of April 1977

[SEAL]

Attest:

RUTH C. MASON
Attesting Officer

C. MARSHALL DANN
Commissioner of Patents and Trademarks